(12) United States Patent
Mazumder et al.

(10) Patent No.: US 8,445,364 B2
(45) Date of Patent: May 21, 2013

(54) METHODS OF TREATING SEMICONDUCTING MATERIALS INCLUDING MELTING AND COOLING

(75) Inventors: Prantik Mazumder, Ithaca, NY (US); Kamal Kishore Soni, Painted Post, NY (US); Christopher Scott Thomas, Horseheads, NY (US); Natesan Venkataraman, Painted Post, NY (US); Glen Bennett Cook, Elmira, NY (US)

(73) Assignee: Corning Incorporated, Corning, NY (US)

( * ) Notice: Subject to any disclaimer, the term of this patent is extended or adjusted under 35 U.S.C. 154(b) by 138 days.

(21) Appl. No.: 12/156,499

(22) Filed: Jun. 2, 2008

(65) Prior Publication Data

US 2009/0297395 A1    Dec. 3, 2009

(51) Int. Cl.
*H01L 21/20* (2006.01)
*H01L 21/36* (2006.01)
*H01L 33/00* (2010.01)
*C23C 16/54* (2006.01)
*C30B 15/14* (2006.01)

(52) U.S. Cl.
USPC ........ 438/486; 438/484; 438/509; 257/E21.3; 117/3

(58) Field of Classification Search .......... 438/486–487, 438/509, 503; 117/3; 257/E21.3
See application file for complete search history.

(56) References Cited

U.S. PATENT DOCUMENTS

| | | | | |
|---|---|---|---|---|
| 4,599,244 A | | 7/1986 | Falckenberg et al. ........... 427/74 |
| 5,665,607 A | * | 9/1997 | Kawama et al. ................ 438/64 |
| 6,111,191 A | | 8/2000 | Hall et al. ..................... 136/258 |
| 6,316,338 B1 | * | 11/2001 | Jung ............................. 438/487 |
| 2005/0095823 A1 | * | 5/2005 | Yang ............................. 438/487 |
| 2005/0150445 A1 | * | 7/2005 | Kim et al. ........................ 117/13 |
| 2005/0272229 A1 | * | 12/2005 | Cao ................................ 438/492 |
| 2006/0102901 A1 | * | 5/2006 | Im et al. .......................... 257/64 |
| 2006/0223328 A1 | * | 10/2006 | Utsunomiya et al. ......... 438/715 |
| 2008/0087213 A1 | | 4/2008 | Sato et al. ....................... 118/47 |
| 2008/0142763 A1 | * | 6/2008 | Rana et al. ................. 252/501.1 |

OTHER PUBLICATIONS

Reber, et al "Crystalline Silicon Thin Film Solar Cells on Foreign Substrates by High Temperature Deposition and Recrystallization", Thin Film Solar Cells: Fabrication, Charaterization and Applications 2006 John Wiley & Sons, Ltd. ISBN 0-470-09126.6.
Reber, et al "High-throughput zone-melting recrystallization for crystalline silicon thin-film solar cells", J. of Crystal Growth 287 (2006) 391-396.

\* cited by examiner

*Primary Examiner* — Daniel Luke
(74) *Attorney, Agent, or Firm* — Michael W. Russell

(57) ABSTRACT

A method for treating semiconducting materials includes providing a semiconducting material having a crystalline structure, pre-heating a portion of the semiconducting material to a temperature less than the melting temperature of the semiconducting material, and then cooling the semiconducting material prior to exposing at least the portion of the semiconducting material to a heat source to create a melt pool, and cooling the semiconducting material.

27 Claims, 4 Drawing Sheets

METHODS OF TREATING SEMICONDUCTING MATERIALS INCLUDING MELTING AND COOLING

FIELD

The present invention relates generally to methods of treating semiconducting materials and treated semiconducting materials.

BACKGROUND

Semiconducting materials find uses in many applications. For example, semiconducting materials can be used in electronic devices as processors formed on semiconductor wafers. As a further example, semiconducting materials are also used to convert solar radiation into electrical energy through the use of photovoltaics.

The semiconducting properties of a semiconducting material may depend on the crystal structure of the material. Faults within the crystal structure of a semiconducting material may diminish the material's semiconducting properties.

Semiconducting materials can be formed using a variety of different methods, at least some of which can lead to materials having less than optimal semiconducting properties. Methods by which single crystalline semiconducting materials are made include, for example, the Czochralski process. Methods by which multicrystalline semiconducting materials are made include, for example, electromagnetic casting and ribbon growth techniques. Another method for producing multicrystalline semiconducting material is disclosed in U.S. Provisional Patent Application No. 61/067,679, filed Feb. 29, 2008, titled "METHOD OF MAKING AN UNSUPPORTED ARTICLE OF A PURE OR DOPED SEMICONDUCTING ELEMENT OR ALLOY, the disclosure of which is hereby incorporated by reference.

While the Czochralski process produces semiconducting material having a single crystalline structure, the method is slow and wasteful. Wafers produced using the Czochralski process are cut from the single crystal, which leads to significant kerf loss.

Ribbon growth techniques can be used to form multicrystalline semiconducting material. The ribbon growth method, however, is a slow process, yielding about 1-2 cm/min. Semiconducting materials produced by the ribbon growth method tend to have long crystals extending in the direction of crystal growth.

Electromagnetic casting may form multicrystalline semiconducting materials in larger quantities, but the technique requires cutting the formed multicrystalline material, which leads to kerf loss. In addition, crystal grains within the semiconducting materials formed by electromagnetic casting process do not have a uniform crystal grain orientation.

In the method disclosed in U.S. Provisional Patent Application No. 61/067,679, multicrystalline semiconducting material is fashioned by forming the semiconducting material on a mold that is immersed in molten semiconducting material.

There is a long-felt need in the industry for a method to treat crystalline semiconducting materials produced by known methods, which method would improve crystal grain structure and/or surface properties of the semiconducting materials.

SUMMARY

In accordance with various exemplary embodiments according to the invention are provided methods for treating a semiconducting material comprising providing a semiconducting material having a crystalline structure, exposing at least a portion of the semiconducting material to a heat source to create a melt pool, and cooling the semiconducting material. The methods according to the present invention may improve at least one of crystal grain structure and surface properties of the semiconducting material.

Other exemplary embodiments according to the invention relate to methods for improving at least one of crystal grain structure and surface properties of a silicon or silicon alloy material comprising providing a silicon or silicon alloy material having a crystalline structure, exposing at least a portion of the silicon or silicon alloy material to a heat source to create a melt pool, and cooling the silicon or silicon alloy material to form a silicon or silicon alloy material having improved crystal grain structure, surface properties, or both.

Other exemplary embodiments according to the invention relate to a semiconducting material treated by a method comprising the steps of providing a semiconducting material having a crystalline structure, exposing at least a portion of the semiconducting material to a heat source to create a melt pool, and cooling the semiconducting material.

As used herein, "improved crystal grain structure" means an improvement in any one or more crystal grain feature of the semiconducting material, such as, for example, crystal grain texture, crystal grain uniformity, and crystal grain size.

As used herein, "improved surface property" means an improvement in any one or more surface property, such as, for example, surface topography and surface appearance. Improved surface property may also include an improvement in the thickness of the semiconducting material, such as, for example, creating a uniform thickness and/or reducing the thickness of the semiconducting material.

As used herein, "crystalline" means any material comprising a crystal structure, including, for example, single crystalline and multicrystalline materials.

As used herein, "multicrystalline" includes any material comprised of a plurality of crystal grains. For example, multicrystalline materials may include polycrystalline, microcrystalline, and nanocrystalline materials.

As used herein, "melt pool" means an amount of molten material collected on or within a semiconducting material, wherein the molten material comprises approximately the same composition as the semiconducting material and is formed by exposing the semiconducting material to a heat source sufficient to cause some portion of the semiconducting material to become molten.

As described herein, the invention relates to methods of treating semiconducting materials and treated semiconducting materials. In the following description, certain aspects and embodiments will become evident. It should be understood that the invention, in its broadest sense, could be practiced without having one or more features of these aspects and embodiments. It should be understood that these aspects and embodiments are merely exemplary and explanatory, and are not restrictive of the invention as claimed.

BRIEF DESCRIPTION OF THE DRAWINGS

The following figures, which are described below and which are incorporated in and constitute a part of the specification, illustrate exemplary embodiments according to the invention and are not to be considered limiting of the scope of the invention, for the invention may admit to other equally effective embodiments. The figures are not necessarily to scale, and certain features and certain views of the figures may be shown exaggerated in scale or in schematic in the interest of clarity and conciseness.

DESCRIPTION OF EXEMPLARY EMBODIMENTS

Figure 1:
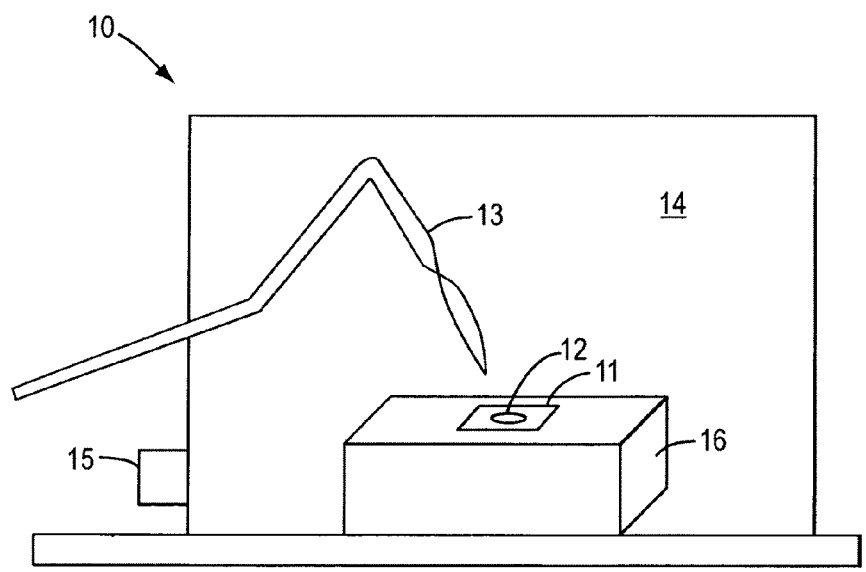
FIG. 1 is a schematic representation of an exemplary apparatus used for treating semiconducting materials according to an exemplary embodiment according to the present invention.

Reference will now be made to various exemplary embodiments according to the invention, at least one example of which is illustrated in the accompanying figures. However, these various exemplary embodiments are not intended to limit the disclosure, but rather numerous specific details are set forth in order to provide a thorough understanding of the invention. However, it will be apparent to one skilled in the art that the invention may be practiced without some or all of these specific details and the disclosure is intended to cover alternatives, modifications, and equivalents. For example, well-known features and/or process steps may not have been described in detail so as not to unnecessarily obscure the invention. In addition, like or identical reference numerals are used to identify common or similar elements.

The present invention contemplates various exemplary embodiments for a method of treating a semiconducting material comprising providing a semiconducting material having a crystalline structure, exposing at least a portion of the semiconducting material to a heat source to create a melt pool, and cooling the semiconducting material. According to further exemplary embodiments, the method of treating said semiconducting material may improve the material's crystal grain structure, surface property, or both.

One exemplary method in accordance with an embodiment according to the present invention may improve at least one of crystal grain structure and surface properties of a silicon or silicon alloy material by providing a silicon or silicon alloy material having a crystalline structure, exposing at least a portion of the silicon or silicon alloy material to a heat source to create a melt pool, and cooling the silicon or silicon alloy material to form a silicon or silicon alloy material having improved crystal grain structure, surface properties, or both. In one exemplary embodiment, a single crystalline semiconducting material may be abutted to a semiconducting material and the melt pool may be created where the semiconducting material abuts the single crystalline semiconducting material. The single crystalline semiconducting material may seed crystal growth in the treated semiconducting material. In another exemplary embodiment, the melt pool may be created on a relatively large crystal grain in the semiconducting material to seed crystal growth on the large crystal.

The present invention also contemplates, in one exemplary embodiment, preheating at least the portion of the semiconducting material which will be subsequently exposed to the heat source prior to treating it. Preheating may minimize the thermal gradient within the semiconducting material, which may reduce thermal stresses. At least the portion of the semiconducting material which will be subsequently exposed to the heat source may be preheated to a temperature sufficient to prevent thermal defects or damage, such as, for example, thermal shock cracking of the semiconducting material when exposed to the heat source to create the melt pool. The temperature sufficient to prevent thermal defects or damage depends on the type and properties of the semiconducting material, the determination of which is within the abilities of one of ordinary skill in the art.

For example, the semiconducting material can be heated to a temperature approaching the melting temperature of the semiconducting material, such as, for example, approximately the same temperature as the melting temperature of the semiconducting material, or for example, approximately 10° C. or more lower than the melting temperature of the semiconducting material. Preheating the semiconducting material to a temperature approaching the melting point of the semiconducting material may provide stress annealing to the semiconducting material, reduce the formation of defects, and improve crystal grain growth. In one exemplary embodiment where the semiconducting material is silicon, at least the portion of the silicon which will subsequently be exposed to the heat source may be preheated to a temperature ranging from about 800° C. to about 1400° C., such as, for example, about 800° C. to about 1300° C. or about 1300° C. to about 1400° C., or to a temperature ranging from about 1300° C. to about the melting temperature of silicon. One of ordinary skill in the art will appreciate when carrying out the present invention that the temperature to which the semiconducting material is preheated will depend on the composition of the semiconducting material. Preheating may, in some embodiments, be part of the semiconducting material formation process, such as, for example, by allowing the newly formed semiconducting material to cool to a temperature sufficient to prevent thermal defects or damage, and then treating the semiconducting material.

In one exemplary embodiment according to the invention, a semiconducting material may be formed by any method known to those skilled in the art. If the resulting semiconducting material has properties, such as crystal grain size or structure and surface topography, that are not optimal, for example because the prior solidification was too rapid, the methods of the present invention can be used to remelt and resolidify the semiconducting material, which may improve the properties by allowing the melt pool to solidify more slowly, for example over several seconds. By allowing the melt pool to solidify slowly, crystal grain formation may be improved and residual thermal stress may be reduced. In addition, larger crystals may be formed by slowly cooling the semiconducting material. In at least one embodiment according to the present invention, cooling may be performed at a temperature near the melting temperature of the semiconducting material or the cooling rate may be controlled to minimize undercooling of larger crystal grains, which may lead to cracking.

It may, in some embodiments, be advantageous to control the uniformity of cooling, for example for the entire semiconducting material being treated. For example, in one embodiment, the temperature of the semiconducting material may be lowered by increasing the distance between the heat source and the semiconducting material. In another exemplary embodiment, such as when the heat source comprises a flame, the cooling of the semiconducting material may be performed by fanning the flame of the heat source over a greater surface area. In another exemplary embodiment, the semiconducting material may be supported by a support that can be heated, and the heat supplied to the support can be gradually reduced to cool the semiconducting material.

Exemplary semiconducting materials that can be treated according to various embodiments of the present invention may include silicon, germanium, gallium arsenide, and alloys and mixtures thereof. In one exemplary embodiment, the treated semiconducting material comprises silicon. While not wanting to be limited in theory and not intending to limit the semiconducting material that can be used in the invention described herein by the following, it is hypothesized that silicon may be useful because of its combination of high heat of fusion and high thermal conductivity, which may allow the input heat flux to be balanced by the heat loss from the melt pool so that a thin piece of silicon can be melted on one side but not the other, if desired. Thus, for example, the semiconducting material to be treated according to methods of the invention may be chosen from silicon with a grain-size distribution that includes, for example, grains smaller than about 50 μm, grains ranging up to about 500 μm, grains ranging from about 100 μm to about 10 mm, or grains ranging from about 50 μm to about 500 μm. The semiconducting material to be treated according to methods of the invention may be chosen from silicon with a topographical variation higher than the average surface height, for example, smaller than about 10 μm, ranging from about 10 μm to about 100 μm, ranging from about 50 μm to about 2 mm, or for example greater than about 1 mm.

The present invention also contemplates, in one exemplary embodiment, a method of treating a semiconducting material wherein after cooling, at least the portion of the treated semiconducting material exposed to the heat source comprises crystal grains wherein at least about 75% by area of a cross section of the treated semiconducting material has crystal grains comprising at least one dimension greater than about 2 times a thickness of the semiconducting material. In at least one further embodiment, at least about 85%, for example at least about 90%, by area of a cross section of the treated semiconducting material has crystal grains comprising at least one dimension greater than about 2 times a thickness of the semiconducting material. In another exemplary embodiment, at least 75% by area of a cross section of the treated semiconducting material has crystal grains after cooling comprising at least one dimension greater than about 3 times the thickness of the semiconducting material. In at least one further embodiment, at least about 85%, for example at least about 90%, by area of a cross section of the treated semiconducting material has crystal grains comprising at least one dimension greater than about 3 times a thickness of the semiconducting material.

Other exemplary embodiments of the present invention contemplate a method of treating a semiconducting material comprising crystal grains wherein after cooling, at least about 75% by area of a cross section of the treated semiconducting material comprises crystal grains having at least one dimension greater than about 500 μm. In at least one further embodiment, at least about 85%, for example at least about 90%, by area of a cross section of the treated semiconducting material has crystal grains comprising at least one dimension greater than about 500 μm. In at least one embodiment, the at least one dimension greater than about 500 μm is greater than a minimum dimension of the semiconducting material. For example, a treated semiconducting material may be in the form of a sheet having a thickness of 200 μm and may comprise at least about 75% by area of a cross section of the treated semiconducting material having crystal grains comprising at least one dimension greater than about 500 μm, wherein the at least one dimension greater than about 500 μm extends substantially coplanar with the semiconducting material sheet.

In at least one embodiment of the present invention, at least about 75% by area of a cross section of the treated semiconducting material comprises individual crystal grains that extend from one surface of the semiconducting material to an opposite surface of the semiconducting material. In at least one further embodiment, at least about 85%, for example at least 90%, by area of a cross section of the treated semiconducting material comprises individual crystal grains that extend from one surface of the semiconducting material to an opposite surface of the semiconducting material.

One method for treating a semiconducting material in accordance with an embodiment according to the present invention contemplates creating a melt pool comprising molten material extending from a top surface of the semiconducting material to a bottom surface of the semiconducting material by exposing the semiconducting material to a heat source, and then cooling the semiconducting material. In one embodiment, the melt pool may be stabilized, for example by wetting to the unmelted semiconducting material at the periphery of the melt pool. One skilled in the art will appreciate when carrying out this exemplary method of the invention that care should be used to avoid the pool becoming too large, which may cause the pool to become unstable and open up to create a hole in the semiconducting material.

Another exemplary method in accordance with an embodiment according to the present invention contemplates creating a melt pool comprising molten material from either a top surface of the semiconducting material or a bottom surface of the semiconducting material by exposing either a top surface or a bottom surface of the semiconducting material to a heat source, and then cooling the semiconducting material. In one exemplary embodiment, it may be desirable to treat the top surface of the semiconducting material and then subsequently treat the bottom surface of the semiconducting material, or vice versa. In a further exemplary embodiment, one surface may be treated and then the second surface may be treated quickly thereafter. This quick succession of treatments may allow the heat from the first treatment to eliminate thermal stresses during the subsequent treatment. In at least one exemplary embodiment according to the present invention, a process of alternating treatment of the top surface and then the bottom surface may be repeated as many times as desired and may further improve the crystal structure and/or surface properties of the semiconducting material. In embodiments wherein the top surface of the semiconducting material is treated, followed by treatment of the bottom surface of the semiconducting material, or vice versa, the melt pool created on both the top and bottom surfaces may optionally extend more than halfway through the thickness of the semiconducting material. Creating a melt pool that extends more than halfway through the thickness of the semiconducting material may create an overlap section that may improve the crystal structure of the entire semiconducting material by progressively improving crystal grain structure.

In one exemplary embodiment according to the present disclosure, a method of treating a semiconducting material comprises exposing at least a portion of the semiconducting material to a heat source by moving the heat source from approximately one edge of the semiconducting material to approximately another edge of the semiconducting material to form an approximately smooth surface upon cooling. In a further exemplary embodiment according to the present invention, the method of treating a semiconducting material comprises exposing at least a portion of the semiconducting material to a heat source to create a melt pool and then cooling, and repeating on another portion of the semiconducting material until an entire surface of the semiconducting material has been treated.

In one exemplary embodiment according to the present invention, a method of treating a semiconducting material comprises exposing at least a portion of a top surface of the semiconducting material to a first heat source and at least a portion of a bottom surface of the semiconducting material to a second heat source to create a melt pool on the top surface and a melt pool on the bottom surface at approximately the same time, and then cooling the semiconducting material.

In another exemplary embodiment according to the present invention, a method of treating a semiconducting material comprises exposing at least a portion of the semiconducting material to a heat source to create a melt pool, and manipulating the melt pool with the heat source to move at least some portion of the molten material around. For example, a portion of the molten material may be moved towards the edges of the semiconducting material to reduce or even out the thickness of the semiconducting material, and the edges trimmed by any method known in the art. In another exemplary embodiment according to the present invention, a material, such as, for example, silicon carbide, carbon, silicon, or silicon dioxide, may be used to wick the molten semiconducting material away from the surface of the semiconducting material.

In another exemplary embodiment according to the present invention, a method of spot-treating a semiconducting material comprises exposing at least a portion of the semiconducting material, for example a semiconducting material which has small crystal grains or a non-uniform thickness, to a heat source to create a melt pool, which may, for example, improve the crystal structure and/or surface properties of the semiconducting material.

In at least one embodiment according to the present invention, a method of treating a semiconducting material may comprise alloying or doping the semiconducting material by depositing an alloying or doping material onto a surface of the semiconducting material, exposing at least a portion of the semiconducting material to a heat source to create a melt pool, wherein the alloying or doping material mixes with the molten semiconducting material, and cooling the semiconducting material. The depth of the material that is alloyed or doped with the semiconducting material may be controlled, for example by controlling the heat flux of the heat source to limit the depth of the melt pool created.

In various exemplary embodiments, the heat source may be locally applied and of sufficient thermal flux to create a melt pool in the semiconducting material, as described herein. The heat source may, in certain exemplary embodiments, be chosen from any heat source sufficient to provide sufficient heat flux, such as, for example, a hydrogen/oxygen torch, a hydrogen/halogen torch (e.g., a hydrogen/chlorine torch), a tungsten inert gas (TIG) torch, optionally comprising a silicon dioxide enclosed tungsten electrode, an IR lamp, such as, for example, a halogen lamp, a laser, an argon or helium plasma torch, and a carbon rod, such as an RF-heated carbon rod, which may optionally be enclosed. In certain exemplary embodiments, it may be advantageous to use a heat source that will not cause contamination of the semiconducting material upon treatment as described herein. For example, when the semiconducting material being treated is silicon, a heat source with a silicon nozzle may be used. In one exemplary embodiment, it may be advantageous to use a hydrogen/oxygen torch with an excess of hydrogen. The heat source may, in certain embodiments, be a single orifice nozzle type, or multiple, line, or shaped nozzle. In at least one embodiment, the heat source may comprise multiple, line, or shaped radiative heat sources.

The appropriate heating for carrying out the methods described herein may easily be determined by one skilled in the art. For example, one skilled in the art may choose the size and/or shape of the heat source to be commensurate with the size and shape of the melt pool, the semiconducting material, or both. In addition, the flow rate of the heat source and the length of time the heat is applied may be varied according to, for example, the size of the melt pool to be created, the heat flux to be controlled, and other factors which one of skill in the art practicing the invention can easily determine. The heat source may, in some embodiment, comprise multiple heat sources, such as, for example, multiple heat sources arranged in an array. The heat source may, in various exemplary embodiments, be movable. The suitable temperature for creating the melt pool may be, for example, the melting temperature of the semiconducting material, or higher.

It may be possible, in some embodiments, to monitor the application of the heat source by observing changes in emissivity of the semiconducting material. For example, in one embodiment where the semiconducting material is chosen from silicon or a silicon alloy, upon application of the heat source the increase in temperature can be monitored by increasing incandescence. Upon melting, however, the emissivity may drop with a corresponding decrease in brightness, despite the fact that the melted area is hotter. When viewed, for example through welders' glass, the skilled artisan may note that the unmelted material is brighter, and may therefore be able to determine the point at which the melt pool is created.

The exposure of the semiconducting material to the heat source in any of the manners described herein may, in some embodiments, affect the ultimate properties of the cooled semiconducting material. As such, the appropriate time and method of exposure can be determined by those of skill in the art based, for example, on the desired properties of the treated material. For example, the heat source may, in some embodiments, be applied in a single area of the semiconducting material. In other embodiments, the heat source may be moved slowly or quickly in any desired pattern over the entirety or selected areas of the semiconducting material. For example, in one embodiment, in order to minimize the formation of surface asperity, the heat source may be applied in such a manner as to move the melt pool smoothly from one side of the semiconducting material to the other, pushing the melt pool front before the heat source without allowing any liquid pockets to become isolated from the melt pool, and then at the conclusion of the pass slowly remove or reduce the heat source as it is moved closer to the edge and the melt pool shrinks. At that point, the skilled artisan can form a single small peak at the edge of the semiconducting material and let it cool.

According to various exemplary embodiments of the invention, the methods described herein can be practiced under ambient conditions, for example in air, or may be practiced in a controlled environment, such as in an enclosure (e.g., a glove box) containing argon, hydrogen, or mixtures thereof, for example.

As described in various exemplary embodiments herein, cooling of the semiconducting material can be effected by any method known to those skilled in the art, and may include, for example, a controlled, slow cooling in an oven or furnace, or a faster convective cooling. Cooling is not, for example, limited to an active step, but may in some embodiments include the removal of the heat source and allowing the material to cool naturally. In various exemplary embodiments, it may be desirable for cooling to occur slowly, which may improve properties such as crystal size, and may decrease residual thermal stress. The optimal rate and method of cooling desired may easily be determined by those skilled in the art and may depend, for example, on the properties desired in the cooled semiconducting material, the type of heat source, the type and thickness of the semiconducting material being treated, etc.

Various embodiments of the present invention also contemplate a semiconducting material treated by a method comprising the steps of providing a semiconducting material having a crystalline structure, exposing at least a portion of the semiconducting material to a heat source to create a melt pool, and cooling the semiconducting material, as described herein.

In accordance with various exemplary embodiments of the present invention, FIG. 1 is a schematic representation of an apparatus 10 to treat a semiconducting material 11 according to methods of the present invention.

Semiconducting material 11 may be chosen from, for example, silicon, germanium, gallium arsenide, and alloys and mixtures thereof. Semiconducting material 11 may be any form, such as, for example, a sheet, a film, a wafer, an ingot, a ribbon, or a rod. In at least one embodiment according to the present invention, semiconducting material 11 comprises a sheet having a thickness ranging from about 50 μm to about 1000 μm or greater. In another embodiment, semiconducting material 11 comprises a sheet having a thickness ranging from about 100 μm to about 300 μm.

In FIG. 1, semiconducting material 11 is supported by support 16. Support 16 may support the entire surface of semiconducting material 11, or support the ends or edges of semiconducting material 11. Support 16 may in some embodiments comprise a refractory material, such as, for example, silicon dioxide. Other material may also be used to form support 16, and may, in some embodiments, be chosen based on the material's ability to resist high temperatures and/or reduce the risk of contaminating semiconducting material 11 with impurities. Support 16 may in some embodiments comprise a heat source.

Semiconducting material 11 and support 16 may optionally be contained within an enclosure 14. The atmosphere within enclosure 14 may, for example, comprise air, hydrogen, argon, and mixtures thereof. In at least one embodiment, the atmosphere within enclosure 14 comprises a mixture of hydrogen and argon. Gases may be supplied to enclosure 14 through gas inlet 15.

A heat source 13 provides heat flux to create a melt pool 12 within semiconducting material 11. Heat source 13 may be chosen from any heat source sufficient to provide sufficient heat flux, which can easily be determined by those skilled in the art. The heat source may be, for example, a hydrogen/oxygen torch, a hydrogen/halogen torch, a tungsten inert gas (TIG) torch optionally comprising a silicon dioxide enclosed tungsten electrode, an IR lamp, such as, for example, a halogen lamp, a laser, an argon or helium plasma torch, or a carbon rod. When a carbon rod is used as heat source 13, the carbon rod may optionally be enclosed to prevent carbon from entering or otherwise contaminating the semiconducting material 11.

Figure 2A:
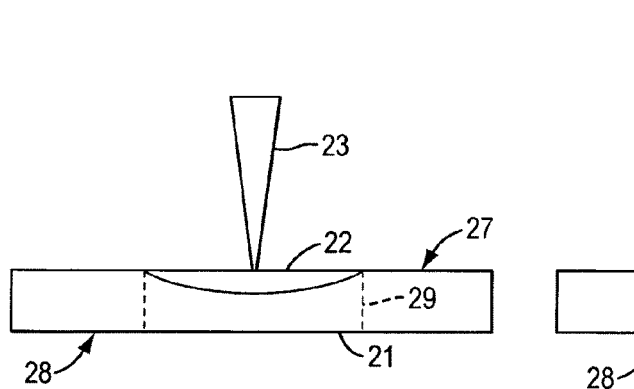
FIG. 2A is a schematic representation of a melt pool formed in a semiconducting material according to an exemplary embodiment according to the present invention.

FIG. 2A depicts the creation of melt pool 22 on a top surface 27 of semiconducting material 21. Heat source 23 provides sufficient heat flux to semiconducting material 21 to create melt pool 22. Although FIG. 2A shows melt pool 22 formed only on top surface 27, in alternative embodiments, melt pool 22 may, for example, extend from top surface 27 to bottom surface 28 (shown as dashed line 29 in FIG. 2A), be formed only on bottom surface 28, be formed on either top surface 27 and subsequently on bottom surface 28 or on bottom surface 28 and subsequently on top surface 27, etc. Melt pools that comprise molten material from both surfaces may be stabilized, for example by wetting to unmelted material at the periphery of the melt pool or by surface tension of the molten material.

The creation of melt pool 22 may, in exemplary embodiments, be determined by visually or optically detecting changes in emissivity. For example, silicon exhibits an increasing emissivity with increases in temperature, but once silicon melts, the emissivity drops precipitously.

Figure 2B:
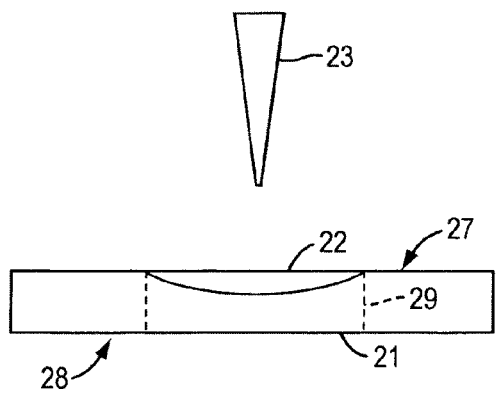
FIG. 2B is a schematic representation of the cooling of a melt pool formed in a semiconducting material according to an exemplary embodiment according to the present invention.

FIG. 2B depicts the semiconducting material with the heat source 23 moved farther away from the top surface 27 of semiconducting material 21, to allow cooling of the semiconducting material.

Figure 3:
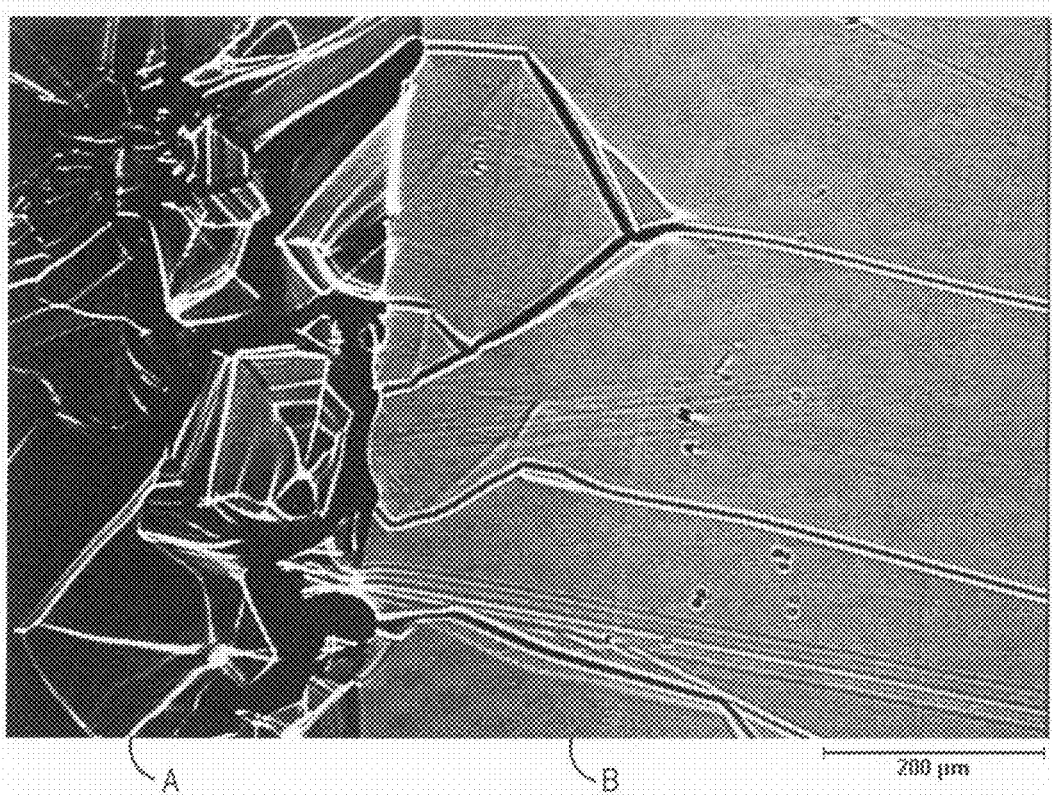
FIG. 3 is a micrograph showing a semiconducting material partially treated according to an exemplary embodiment according to the present invention.

FIG. 3 is a micrograph showing a silicon material that has been partially treated by a method according to the present invention. Side A was not treated and side B was treated by a method according to the present invention. Treated side B shows a smoother surface and larger crystal grain sizes compared to untreated side A. In at least one embodiment according to the present invention, the semiconducting material has a more uniform surface than untreated semiconducting material, for example a surface with a topographic variation of less than 10 μm.

Figure 4:
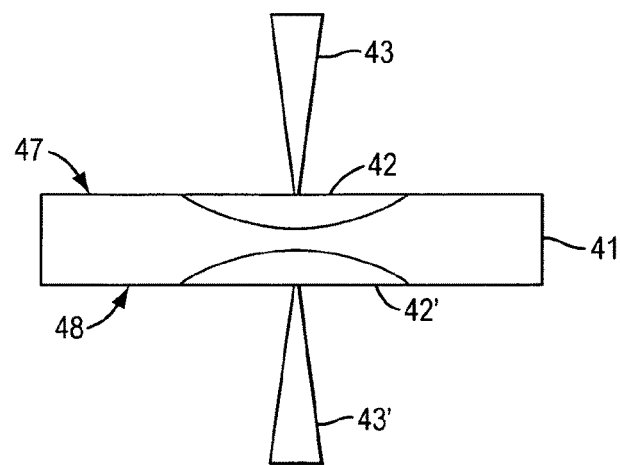
FIG. 4 is a schematic representation of melt pools formed in a semiconducting material by an exemplary embodiment according to the present invention.

FIG. 4 depicts a method of treating a semiconducting material 41 according to a further exemplary embodiment according to the present invention. Semiconducting material 41 is approximately simultaneously exposed to a first heat source 43 on a top surface 47 of semiconducting material 41 and a second heat source 43' on a bottom surface 48 of semiconducting material 41 to create melt pools 42 and 42', respectively.

Figures 5A, 5B:
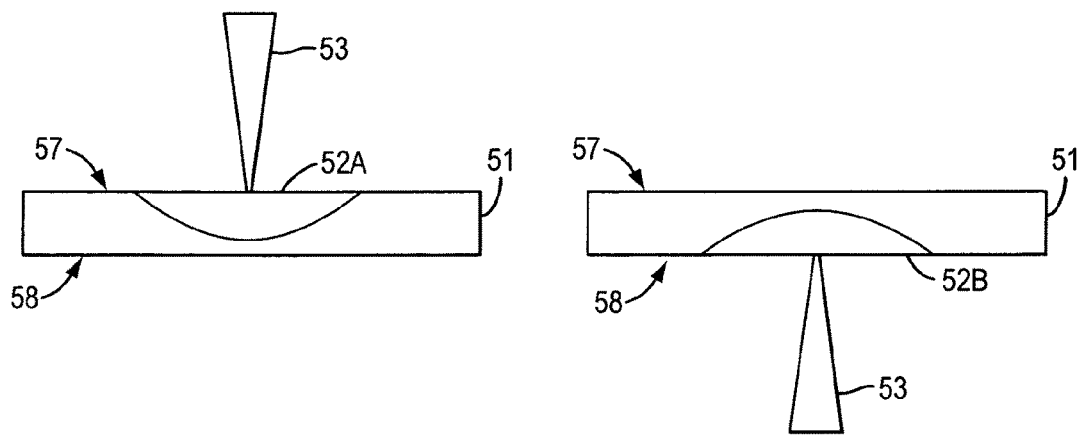
FIGS. 5A to 5D are schematic representations of a method according to an exemplary embodiment according to the present invention.
Figure 5C:
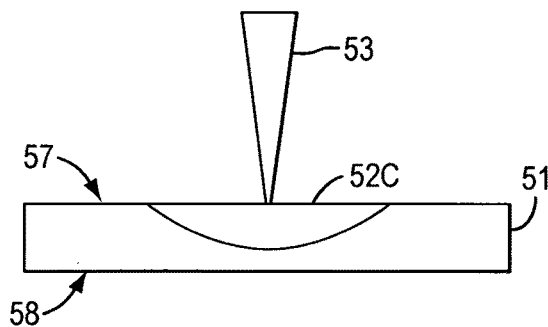
Figure 5D:
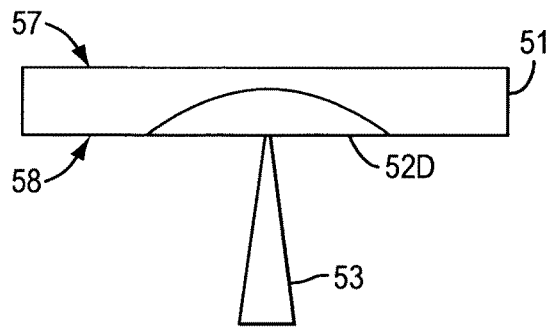

FIGS. 5A to 5D shows an exemplary method according to one embodiment according to the present invention. In FIG. 5A, a top surface 57 of semiconducting material 51 is exposed to a heat source 53 to create a melt pool 52A. Subsequently, a bottom surface 58 of semiconducting material 51 is exposed to heat source 53 to create a melt pool 52B, as shown in FIG. 5B. Top surface 57 and bottom surface 58 are exposed to heat source 53 repeatedly to sequentially create melt pools 52C and 52D, in FIGS. 5C and 5D. This process may be repeated, for example to further refine the crystal grain structure of the semiconducting material. Heat source 53 may comprise a single heat source, or multiple heat sources.

It is noted that, as used in this specification and the appended claims, the singular forms "a," "an," and "the," include plural referents unless expressly and unequivocally limited to one referent, and vice versa. Thus, by way of example only, reference to "a heat source" can refer to one or more heat sources, and reference to "a semiconducting material" can refer to one or more semiconducting materials. As used herein, the term "include" and its grammatical variants are intended to be non-limiting, such that recitation of items in a list is not to the exclusion of other like items that can be substituted or added to the listed items.

It will be apparent to those skilled in the art that various modifications and variation can be made to the programs and methods of the present disclosure without departing from the scope its teachings. Other embodiments of the disclosure will be apparent to those skilled in the art from consideration of the specification and practice of the teachings disclosed herein. It is intended that the embodiments described in the specification be considered as exemplary only.

What is claimed is:

1. A method of treating a semiconducting material, comprising:
    providing a semiconducting material having a crystalline structure;
    exposing at least a portion of the semiconducting material to a torch to create a melt pool; and
    solidifying the semiconducting material, wherein the torch comprises a nozzle made from the semiconducting material.

2. The method of claim 1, wherein said treating of said semiconducting material improves at least one of crystal grain structure and surface properties of the semiconducting material.

3. The method of claim 1, wherein at least the portion of the semiconducting material which will be exposed to said torch is preheated to a temperature of about 10° C. less than the melting temperature of the semiconducting material prior to creating the melt pool.

4. The method of claim 1, wherein the semiconducting material comprises silicon, germanium, gallium arsenide, alloys of silicon, alloys of germanium, alloys of gallium arsenide, or mixtures thereof.

5. The method of claim 1, wherein the semiconducting material comprises silicon or a silicon alloy.

6. The method of claim 5, wherein after solidifying, at least about 75% by area of a cross-section of the semiconducting material comprises crystal grains having at least one dimension greater than about 2 times a thickness of the semiconducting material.

7. The method of claim 5, wherein after solidifying, at least about 75% by area of a cross-section of the semiconducting material comprises crystal grains having at least one dimension greater than about 500 µm.

8. The method of claim 1, wherein the melt pool comprises molten material extending from a top surface of the semiconducting material to a bottom surface of the semiconducting material.

9. The method of claim 1, wherein the melt pool comprises molten material from either a top surface of the semiconducting material or a bottom surface of the semiconducting material.

10. A method of improving at least one of crystal grain structure and surface properties of a silicon or silicon alloy material, comprising:
    providing a silicon or silicon alloy semiconducting material having a crystalline structure;
    exposing at least a portion of the silicon or silicon alloy material to a torch to create a melt pool; and
    solidifying the silicon or silicon alloy material to form a treated silicon or silicon alloy material having improved crystal grain structure, surface properties, or both, wherein the torch comprises a nozzle made from the semiconducting material.

11. The method of claim 10, wherein after solidifying, at least about 75% by area of a cross-section of the treated silicon or silicon alloy material comprises crystal grains having at least one dimension greater than about 2 times a thickness of the silicon or silicon alloy material.

12. The method of claim 10, wherein after solidifying, at least about 75% by area of a cross-section of the treated silicon or silicon alloy material comprises crystal grains having at least one dimension greater than about 500 µm.

13. The method of claim 10, wherein at least the portion of the silicon or silicon alloy material which will be exposed to said torch is preheated to a temperature of about 10° C. less than the melting temperature of the semiconducting material prior to creating the melt pool.

14. The method of claim 10, wherein exposing at least a portion of the silicon or silicon alloy material to a torch comprises moving the torch from approximately one edge of the silicon or silicon alloy material to approximately another edge of the silicon or silicon alloy material to form an approximately smooth surface upon solidifying.

15. A semiconducting material treated by a method comprising the steps of
    providing a semiconducting material having a crystalline structure;
    exposing at least a portion of the semiconducting material to a torch to create a melt pool; and
    solidifying the semiconducting material, wherein the torch comprises a nozzle made from the semiconducting material.

16. The semiconducting material of claim 15, wherein at least the portion of the solidified semiconducting material exposed to the torch has a maximum topographic variation of less than about 10 µm.

17. The semiconducting material of claim 15, wherein the semiconducting material comprises silicon, germanium, gallium arsenide, alloys of silicon, alloys of germanium, alloys of gallium arsenide, or mixtures thereof.

18. The semiconducting material of claim 17, wherein the semiconducting material comprises silicon or a silicon alloy.

19. The semiconducting material of claim 18, wherein after solidifying, at least about 75% by area of a cross-section of the solidified semiconducting material comprises crystal grains having at least one dimension greater than about 2 times a thickness of the semiconducting material.

20. The semiconducting material of claim 18, wherein after solidifying, at least about 75% by area of a cross-section of the solidified semiconducting material comprises crystal grains having at least one dimension greater than about 500 µm.

21. The method of claim 1, wherein the semiconducting material has a thickness ranging from about 50 to 1000 microns.

22. A method of treating a semiconducting material, comprising:
    providing a semiconducting material having a crystalline structure;
    exposing a top surface of the semiconducting material to a first torch to create a melt pool in the top surface;
    solidifying the semiconducting material; and then
    exposing a bottom surface of the semiconducting material to a second torch to create a melt pool in the bottom surface; and
    solidifying the semiconducting material, wherein at least one of the first torch and the second torch comprises a nozzle made from the semiconducting material.

23. The method of claim 3, wherein the preheating comprises heating to a temperature ranging from about 800° C. to about 1400° C.

24. The method of claim 1, wherein the torch is selected from the group consisting of a hydrogen/oxygen torch, a hydrogen/halogen torch, a tungsten inert gas torch, an argon plasma torch and a helium plasma torch.

25. The method of claim 1, wherein the torch has a single, multiple, line, or shaped nozzle.

26. The method of claim 1, wherein the torch is a hydrogen/oxygen torch using an excess of hydrogen.

27. The method of claim 1, wherein the exposing is carried out in an enclosure containing argon, hydrogen, or mixtures thereof.

* * * * *